(12) United States Patent
Endo et al.

(10) Patent No.: US 7,173,188 B2
(45) Date of Patent: Feb. 6, 2007

(54) STRAIGHT ANGLE CONDUCTOR AND METHOD OF MANUFACTURING THE SAME

(75) Inventors: Yuju Endo, Tokyo (JP); Hakaru Matsui, Tokyo (JP); Seigi Aoyama, Tokyo (JP); Takaaki Ichikawa, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 10/891,456

(22) Filed: Jul. 15, 2004

(65) Prior Publication Data

US 2005/0039943 A1 Feb. 24, 2005

(30) Foreign Application Priority Data

Jul. 15, 2003 (JP) ............. 2003-197242
Dec. 24, 2003 (JP) ............. 2003-427591

(51) Int. Cl.
*H02G 3/06* (2006.01)
(52) U.S. Cl. .................. 174/94 R; 174/117 FF
(58) Field of Classification Search .......... 174/117 FF, 174/94 R; 257/748
See application file for complete search history.

(56) References Cited

U.S. PATENT DOCUMENTS

| | | | |
|---|---|---|---|
| 3,147,414 A * | 9/1964 | Pelfrey et al. ............. | 257/748 |
| 4,521,801 A * | 6/1985 | Kato et al. ................ | 257/748 |
| 6,172,296 B1 * | 1/2001 | Iwasaki et al. ............. | 136/256 |
| 6,395,972 B1 | 5/2002 | Tran et al. | |
| 6,653,736 B2 * | 11/2003 | Kishimoto et al. ......... | 257/758 |
| 2003/0021718 A1 * | 1/2003 | Munekata et al. ......... | 420/560 |
| 2003/0024733 A1 | 2/2003 | Aoyama et al. | |
| 2003/0049884 A1 * | 3/2003 | Lutz ............................ | 438/106 |
| 2003/0089923 A1 * | 5/2003 | Oida et al. .................. | 257/200 |
| 2005/0121320 A1 * | 6/2005 | Okabe et al. .......... | 204/298.13 |

FOREIGN PATENT DOCUMENTS

| JP | 11-21660 A | | 1/1999 |
|---|---|---|---|
| JP | 2001-192774 | * | 7/2001 |
| JP | 2002-164560 A | | 6/2002 |
| JP | 2002-263880 A | | 9/2002 |

* cited by examiner

*Primary Examiner*—Chau N. Nguyen
(74) *Attorney, Agent, or Firm*—Foley & Lardner LLP

(57) ABSTRACT

A straight angle conductor 10 is provided with a cladding material including a core-sheet metal 11 and conductor-sheet metals 12a, 12b that sandwich both surfaces of the core-sheet metal 11. The conductor-sheet metals 12a, 12b having a volume resistivity equal to or less than 5.0 ($\mu\Omega \cdot$cm) wraps both sides of the core-sheet metal 11 having a thermal expansion coefficient equal to or less than 10 ($\times 10^{-6}$/C. °) to prevent the core-sheet metal 11 from being exposed to an outside of the conductor-sheet metals 12a, 12b. As a result, it prevents occurrence of an electrical potential difference in a boundary side face between the core-sheet metal 11 and the conductor-sheet metals 12a, 12b to improve corrosion resistance. Especially even when the straight angle conductor 10 is used on a silicon crystal wafer for a solar cell, damage of the silicon crystal wafer caused by heat occurring in soldering process of the conductor 10 or a change in temperature on use thereof for a solar cell is avoided.

9 Claims, 4 Drawing Sheets

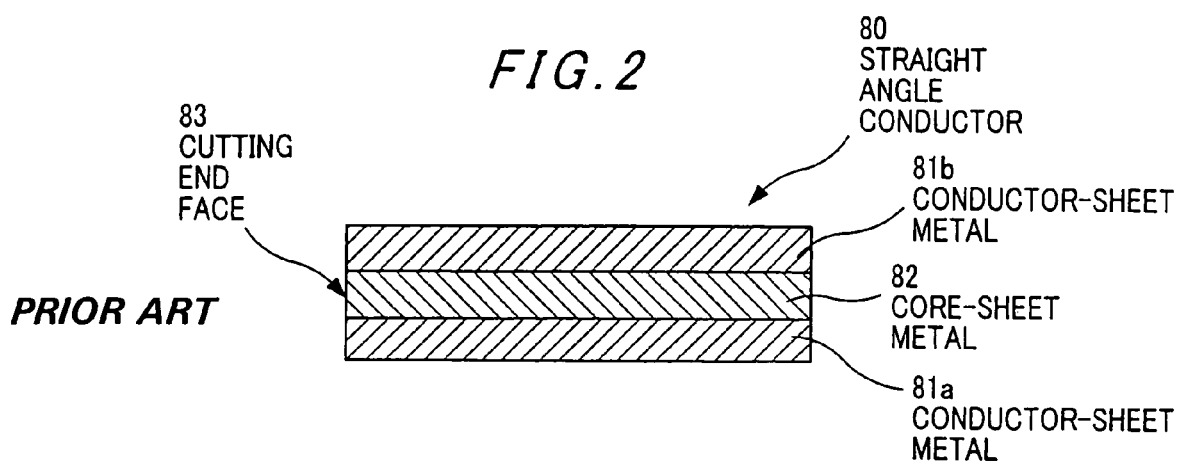
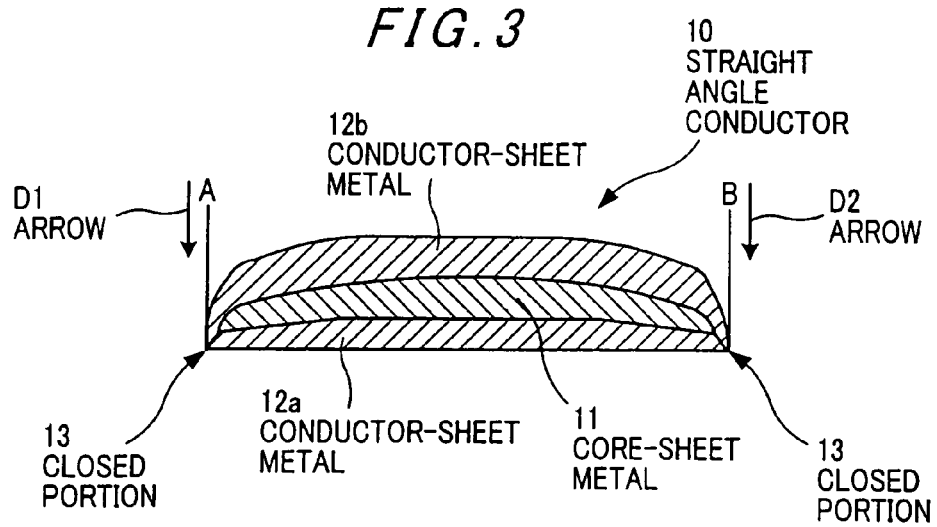
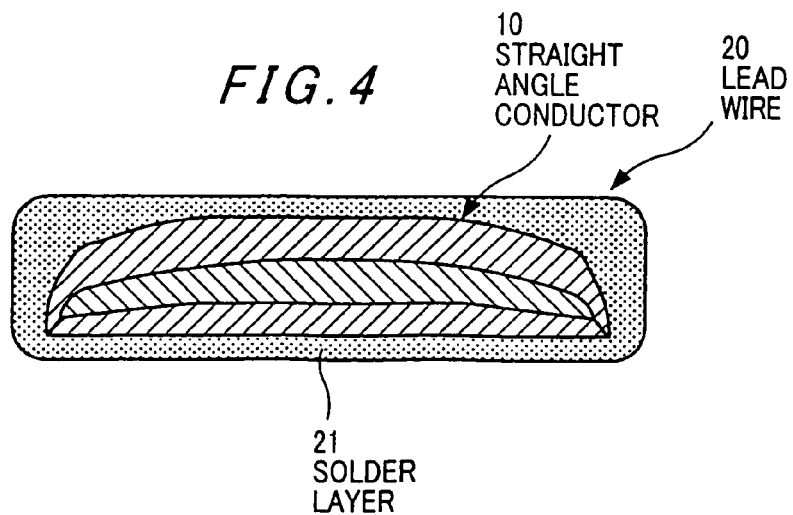

STRAIGHT ANGLE CONDUCTOR AND METHOD OF MANUFACTURING THE SAME

The present application is based on Japanese patent applications No. 2003-197242 and No. 2003-427591, the entire contents of which are incorporated herein by reference.

BACKGROUND OF THE INVENTION

1. Field of the Invention

The present invention relates to a straight angle conductor and a method of manufacturing the same, and in particular to a straight angle conductor with a cladding material including a core-sheet material and a conductor-sheet material that sandwiches the core-sheet material.

2. Description of the Related Art

As a solar cell a semiconductor chip has been used in which silicon crystal wafer is grown on a substrate. A connection-lead wire is soldered to a predetermined area (contact area) of a silicon crystal wafer that results from cutting and dividing this semiconductor chip. The power is transmitted (outputted) through the connection-lead wire.

A solder plated layer is usually formed on a surface of a conductor as a part of the connection-lead wire for connection of the conductor with the silicon crystal wafer. As the conductor, for instance, is used a straight angle conductor made of pure copper such as tough pitch copper or oxygen free high conductivity copper, and as the solder plated layer is used Sn—Pb eutectic solder (See, for instance, Japanese Unexamined Patent Publication No. 11-21660). In place of the Sn—Pb eutectic solder, however, there has recently come to study use of a solder which does not contain Pb (Pb free solder) as the solder-plated layer material from a viewpoint of an environment (See, for instance, Japanese Unexamined Patent Publication No. 2002-263880).

Further, a silicon crystal wafer among components included in a solar cell occupies most of material costs, so that a study on how to manufacture a thinner silicon crystal wafer has been made for decrease of manufacturing costs. When the silicon crystal wafer is, however, designed to be thinner, damage in the silicon crystal wafer tends to be produced due to heating process on soldering connection of the connection-lead wire thereto or due to a change in temperature for use in the solar cell. To cope with this problem, there exist increasing demands for a connection-lead wire of a small thermal expansion coefficient and a connection-solder plated layer of a low melting temperature.

As one example of a lead wire having a small thermal expansion coefficient, there is a lead frame formed of a plate or a rod member configured by cladding an INVER (registered trademark) with copper materials (namely, in the form of copper—INVER (registered trademark)—copper) (See, for instance, Japanese Unexamined Patent Publication No. 2002-164560)

SUMMARY OF THE INVENTION

However, the lead frame described in Japanese Unexamined Patent Publication No. 2002-164560 is cut to form a circuit whereby a large amount of wasteful materials are produced, causing an increase of manufacturing costs.

When a lead wire, such as the lead frame described in Japanese Unexamined Patent Publication No. 2002-164560, using a straight angle conductor having a cladding material in the form of copper—INVER (registered trademark)—copper is corrected to be linear by applying tensile stress thereto so that the lead wire is more easily soldered to a contact area of the silicon crystal wafer, it tends to cause warping of the lead wire. Therefore, there occurs the problem that the lead wire with the warping generated is not properly soldered to the silicon crystal wafer.

In view of the above, there exists a need for a straight angle conductor which overcomes the above-mentioned problems in the related art. The present invention addresses this need in the related art as well as other needs, which will be apparent to those skilled in the art from this disclosure.

An object of the present invention is to provide a straight angle conductor with a cladding material, which can improve performance of the straight angle conductor.

In order to achieve the above-described object, one aspect of the present invention is to provide a straight angle conductor comprising a cladding material including a core-sheet metal and a conductor-sheet metal that sandwiches both surfaces of the core-sheet metal, The conductor-sheet metal wraps both side end faces of the core-sheet metal to prevent the core-sheet metal from being exposed to an outside of the conductor-sheet metal. As a result, it prevents generation of an electrical potential difference in a boundary side face between the core-sheet metal and the conductor-sheet metal, to improve corrosion resistance.

Further, one aspect of the present invention is to provide a straight angle conductor comprising a cladding material including a core-sheet metal and a conductor-sheet metal that sandwiches both surfaces of the core-sheet metal. The conductor-sheet metal having a volume resistivity equal to or less than 5.0 ($\mu\Omega\cdot$cm) wraps both side end faces of the core-sheet metal having a thermal expansion coefficient equal to or less than 10 ($\times 10^{-6}$/C. °) to prevent the core-sheet metal from being exposed to an outside of the conductor-sheet metal. As a result, it also improves transmission characteristic as well as corrosion resistance as described above, and especially even when the straight angle conductor is used on a silicon crystal wafer for a solar cell, damage of the silicon crystal wafer caused by heat generated in soldering process of the conductor to the silicon crystal wafer or caused by a change in temperature for use in the solar cell is avoided.

Furthermore, one aspect of the present invention is to provide a straight angle conductor comprising a cladding material including a core-sheet metal having a thermal expansion coefficient equal to or less than 10 ($\times 10^{-6}$/C. °) and a conductor-sheet metal having a volume resistivity equal to or less than 5.0 ($\mu\Omega\cdot$cm) that sandwiches both surfaces of the core-sheet metal. As a result, it improves transmission characteristic as described above.

Herein it is preferable that the conductor-sheet metal has a crystal orientation with the following equation;

$$IR = I(111)/\{I(200)+I(111)\} \geq 0.15.$$

Herein I (111): X ray diffraction intensity of Surface (111). I (200): X ray diffraction intensity of Surface (200)

Thereby even if tensile stress is applied to the straight angle conductor for soldering it to a silicon crystal wafer, warping of the conductor is not generated, so that the conductor is properly soldered thereto.

On the other hand, a method of manufacturing a straight angle conductor according to one aspect of the present invention comprises the steps of:

providing a cladding material including a core-sheet metal and a conductor-sheet metal that sandwiches both surfaces of the core-sheet metal, and providing a cutting device, wherein an edge portion of at least one of a pair of cutting blades of the cutting device is chamfered in a curve shape, and cutting the cladding material by the cutting device. As a result, it reduces materials to be wasted on machining it, to cut down on manufacturing costs.

Herein when cladding material is cut by the cutting device, it is preferable that a cutting-shear drop of the conductor-sheet metal produced during the cutting of the conductor-sheet metal further wraps cutting side end faces of the core-sheet metal. Thereby the cutting side end faces of the core-sheet metal can be wrapped by the conductor-sheet metal without a special machining other than the cutting device, to prevent the core-sheet metal from being exposed to an outside of the conductor-sheet metal. As a result, it prevents generation of an electrical potential difference in the cladding material, to improve corrosion characteristic and also cuts down on manufacturing costs.

And further it is preferable that an edge portion of a blade in the cutting device is machined to have a curved surface with a radius equal to or more than 1/50 the thickness of the cladding material. Accordingly, the cladding material is cut with this blade, which causes a cutting-shear drop of the conductor-sheet metal in size sufficient for wrapping the core-sheet metal to be produced.

And it is also preferable that the core-sheet metal has a Vickers hardness equal to or less than 150 Hv and the conductor sheet metal has a Vickers hardness equal to or less than 100 Hv, which, as a result, produces more flexibility of the cladding material, causing easier generation of a cutting-shear drop of the conductor-sheet metal.

Further, one aspect of the present invention is to provide a straight angle conductor comprises a cladding material including a core-sheet metal and a conductor-sheet metal that sandwiches both surfaces of the core-sheet metal. An entirety or a part of an outer surface of the conductor-sheet metal is coated with a Sn—Pb solder layer or a Pb free solder layer. Accordingly when the straight angle conductor coated is used a lead wire for a solar cell, melting temperature in soldering the lead wire thereto is lowered to prevent damage of a silicon crystal wafer of the solar cell, as well as soldering areas are reduced to cut down on assembly costs.

These and other objects, features, aspects and advantages of the present invention will become apparent to those skilled in the art from the following detailed description, which, taken in conjunction with the annexed drawings, discloses a preferred embodiments of the present invention.

BRIEF DESCRIPTION OF THE DRAWINGS

Referring now to the attached drawings which form a part of this original disclosure:

FIG. 2 is a transverse sectional view of a straight angle conductor formed of a cladding material of the related art.

FIG. 3 is a transverse sectional view of a straight angle conductor according to a first embodiment of the present invention;

FIG. 4 is a transverse sectional view of a lead wire using the straight angle conductor in FIG. 3;

DETAILED DESCRIPTION OF THE PREFERRED EMBODIMENTS

Selected embodiments of the present invention will now be explained with reference to the drawings. It will be apparent to those skilled in the art from this disclosure that the following description of the embodiments of the present invention is provided for illustration only, and not for the purpose of limiting the invention as defined by the appended claims and their equivalents.

First Embodiment

Figure 1:
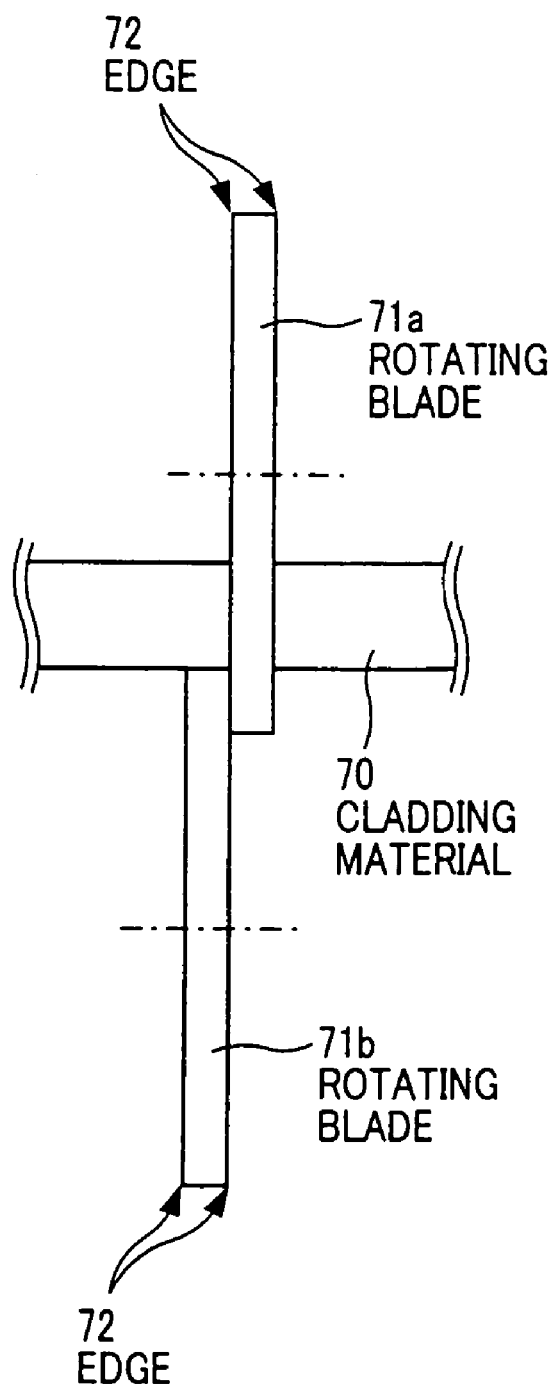
FIG. 1 is a partially enlarged transverse sectional view of a cutting device used for a cutting method by a slit method of the related art.

FIG. 2 shows a straight angle conductor 80 formed of a cladding material in the form of a copper material (conductor-sheet metal) 81a—an INVER (registered trademark) material (core-sheet metal) 82—a copper material (conductor-sheet metal) 81b with regard to the related art. This straight angle conductor 80 is produced by cutting the cladding material according to a slit method generally known as a cutting method with respect to metallic materials. In particular, as shown in FIG. 1, a cladding material 70 is cut successively in the direction perpendicular to the figure by using two sets of a pair of rotating blades 71a, 71b each of which is disposed above and under the cladding material 70 (only one set of a pair of blades shown in FIG. 1), to obtain the straight angle conductor 80 shown in FIG. 2.

Each edge 72 of the rotating blades 71a, 71b is finished in a sharp state or substantially vertical angle by grinding or the like. Each cutting end face (side end face) 83 of the straight angle conductor 80 produced by the cutting is formed substantially vertical to an upper face and a lower face where the copper materials 81a, 81b and the INVER (registered trademark) material 82 are completely exposed at each side end face thereof. Each connection portion between the copper materials 81a and the INVER (registered trademark) material 82 and between the copper material 81b and the INVER (registered trademark) material 82 is a different-property contact portion, which causes an electrical potential difference in each connection portion due to contact of water components therewith. As a result, corrosion tends to occur in each connection portion.

Therefore, a straight angle conductor according to a first embodiment of the present invention is provided with a cladding material in which both surfaces of a core-sheet metal 11 are sandwiched by conductor-sheet metals 12a, 12b, wherein the conductor-sheet metals 12a, 12b wrap both side end faces (both right-handed and left-handed end faces in FIG. 3) of the core-sheet metal 11 to prevent the core-sheet metal 11 from being exposed at the outermost surface thereof to an outside of the conductor-sheet metals 12a, 12b. Both ends of the conductor-sheet metals 12a, 12b are respectively closed-combined to form a closed portion 13.

A straight angle conductor 10 is formed by cutting a cladding material at A and B positions in the direction of the arrows D1 and D2. The core-sheet metal 11 and the conductor-sheet metals 12a, 12b of the straight angle conductor 10 are configured so that both end portions thereof in the width direction (right-handed and left-handed directions in FIG. 3) are gradually curved toward the direction of the arrow D1, and a bottom of the conductor-sheet metal 12a is formed flat through the entirety thereof.

The conductor-sheet metals 12a, 12b have a random isotropic crystal orientation and an IR value shown in the following equation, which is equal to or more than 0.15, preferably 0.20–0.70, particularly preferably 0.35–0.70.

$$IR = I(111)/\{I(200)+I(111)\} \geq 0.15.$$

Herein I (111): X ray diffraction intensity of Surface (111). I (200): X ray diffraction intensity of Surface (200).

The core-sheet metal 11 is formed of material having a thermal expansion coefficient equal to or less than 10 ($\times 10^{-6}$/C. °), for instance, a Fe—Ni alloy material, preferably an INVER (registered trademark). The conductor-sheet metals 12a, 12b are formed of material having a volume resistivity equal to or less than 5.0 ($\mu\Omega \cdot cm$), for instance, a material such as Cu, Ag, Au, Al, or a combination thereof where the Cu or the Cu alloy is preferable in terms of cost performance and the Ag or Ag alloy is preferable in terms of low volume resistivity (high conductivity). Further, it is preferable that the core-sheet metal 11 has a Vickers hardness equal to or less than 150 Hv and the conductor sheet metal has a Vickers hardness equal to or less than 100 Hv.

The best mode of the straight angle conductor 10 is the combination of the core-sheet metal 11 made of the INVER (registered trademark) and the conductor-sheet metals 12a, 12b made of Ag or Ag alloy, as well as having the IR value of 0.35–0.70.

A lead wire 20 is provided by coating an entire outer surface of the straight angle conductor 10 shown in FIG. 3 with a solder layer 21 as shown in FIG. 4.

Herein only apart of the outer surface of the straight angle conductor 10 (for instance, an upper and a lower surface of the straight angle conductor 10) may be coated by the solder layer 21. This lead wire 20 is connected to a predetermined contact area (for instance, Ag coating area) of a cell surface in a silicon crystal wafer (a solar cell module (not shown)) and a predetermined contact area of a frame member (for instance, lead frame), thereby to provide a solar cell assembly. The solder layer for connection may be disposed at the predetermined contact areas of the cell surface and the lead frame.

The solder layer 21 is made of a Sn—Pb eutectic solder or a Pb free solder, preferably a Pb free solder of Sn—Ag—Cu. The Pb free solder of Sn—Ag—Cu may contain In and/or P. It is preferable that content of In is 1–10% in weight and content of P is 0.005–0.015% in weight. For instance, as the Pb free solder of Sn—Ag—Cu is used:

Sn-3 (or 4)Ag-0.5 Cu-0.01P,
Sn-3 (or 4)Ag-0.5 Cu-3 In,
Sn-3 (or 4)Ag-0.5 Cu-3 In - 0.01P,
Sn-3 (or 4)Ag-0.5 Cu-5 In,
Sn-3 (or 4)Ag-0.5 Cu-5 In-0.01P,
Sn-3 (or 4)Ag-0.5 Cu-8 In, or
Sn-3 (or 4)Ag-0.5 Cu-8 In-0.01P (weight % as unit).

A melting temperature of the Pb free solder is in general higher than that of the Sn—Pb eutectic solder, which tends to cause damage of a connected material (contact areas of the cell surface and the lead frame) due to solder connection. However, solders of Sn-3Ag-0.5Cu and Sn-4Ag-0.5Cu out of the Pb free solders (weight % as unit) have the feature that the melting temperature thereof is low. And the melting temperature of the solder can be further lowered by allowing the solder to contain In and/or P in addition.

Accordingly the Pb free solder of the Sn—Ag—Cu is used as the solder layer 21, which can reduce possible deformation or damage of the silicon cell when connected by soldering. The reason why content of the In is 1–10% in weight is that if the content of the In exceeds 10% in weight, viscosity of the melting solder becomes high, which causes deterioration of soldering work efficiency and also 0.005–0.015% in weight of P content prevents oxide discoloration of the solder on soldering work, thereby to improve reliability of solder connection.

The layer thickness of the solder layer 21 is 1/30–1/3 that of the straight angle conductor 10, preferably 1/10–1/3.

The best mode of the lead wire 20 is configured in such a way that the straight angle conductor 10 is formed by combining the core-sheet metal 11 made of the INVER (registered trademark) with the conductor-sheet metals 12a, 12b made of the Ag or the Ag alloy and an outer surface of the straight angle conductor 10 is coated with the solder layer 21 of the Sn—Ag—Cu having 1/5 thickness of the straight angle conductor 10.

Operations according to the present embodiment will be explained next.

In the straight angle conductor 10 according to the present embodiment, the entire outer surface of the core-sheet metal 11 is covered and wrapped by the conductor-sheet metals 12a, 12b and thereby in spite of the cladding material, the connection portion of the materials having different properties is not exposed to the outermost surface thereof at all. As a result, even if the water components are contacted to the straight angle conductor 10, the electrical potential difference on the outermost surface of the straight angle conductor 10 is not generated, which does not result in corrosion thereon, thereby to provide the straight angle conductor 10 with a good corrosion resistance.

Since in the straight angle conductor 10 according to the present embodiment, the electrical potential difference on the outermost surface thereof is not generated, the straight angle conductor 10 can be used as a lead wire without coating the entire outer surface of the straight angle conductor 10 with the solder layer 21 for preventing the electrical potential difference. Therefore, coating only a part (in the vicinity of the contacting portion with each contact area) of the straight angle conductor 10 with the solder layer 21 is sufficient in terms of the soldering of the straight angle conductor 10, which results in cost reduction of the lead wire 20. Further, in case a solder layer for connection has been formed in predetermined contact areas of the cell surface and the lead frame, the straight angle conductor 10 can be used as a lead wire having a good corrosion resistance as it is.

Further, the lead wire 20 using the straight angle conductor 10 according to the present embodiment, has a good corrosion resistance and therefore, even if a solar cell assembly configured by using the lead wire 20 is used for a long period, it does not cause any possible deterioration of power generation efficiency, to improve a long-term reliability.

Next, a method of manufacturing a straight angle conductor 10 according to the present embodiment will be explained with reference to accompanying drawings.

A method of manufacturing a straight angle conductor 10 according to the embodiment is to cut with a slit method a cladding material formed of sandwiching both surfaces of a core-sheet metal by conductor-sheet metals.

Figure 5:
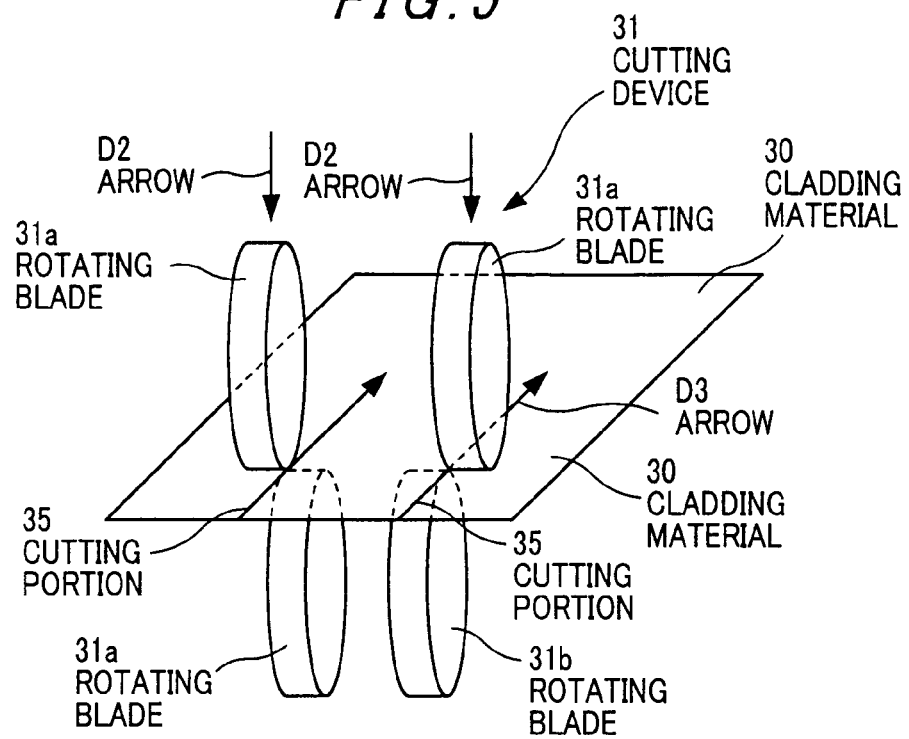
FIG. 5 is a perspective schematic view of a cutting device used for a method of manufacturing the straight angle conductor in FIG. 3.

In detail, firstly both surfaces of the core-sheet metal are sandwiched by the conductor-sheet metals and there after, cold rolling work and thermal treatment are repeated as needed to provide a cladding material 30 having a desired thickness as shown in FIG. 5. In this case the core-sheet metal having a Vickers hardness equal to or less than 150 Hv and the conductor-sheet metal having a Vickers hardness equal to or less than 100 Hv are used. And the core-sheet metal having a thermal expansion coefficient equal to or less than 10 ($\times 10^{-6}$/C. °) and the conductor-sheet metal having a volume resistivity equal to or less than 5.0 ($\mu\Omega \cdot$cm) are used.

Figure 6:
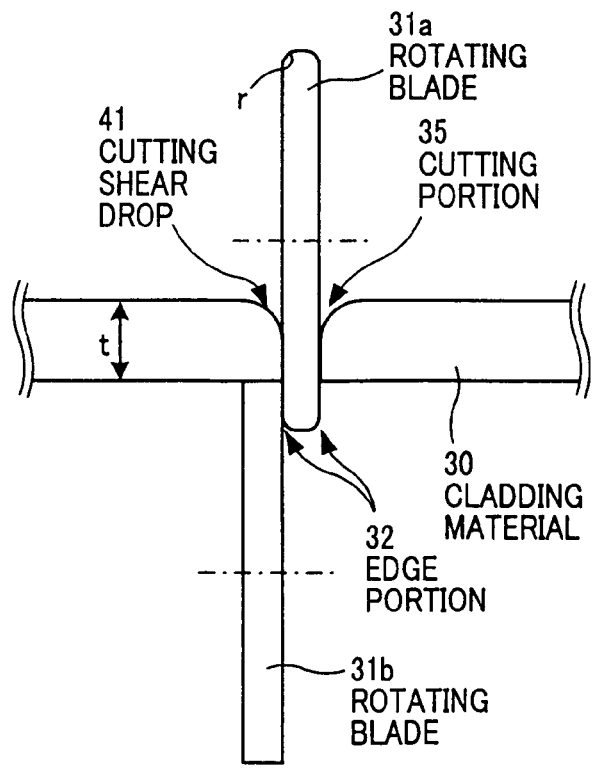
FIG. 6 is a partially enlarged transverse sectional view of the cutting device used for the method of manufacturing the straight angle conductor in FIG. 3.

Next, as shown in FIG. 5 and 6, the cladding material 30 provided is cut by a cutting device 31 that has two sets of a pair of rotating blades 31*a*, 31*b*, the blade 31*a* being disposed above the cladding material 30 and the blade 31*b* thereunder. The rotating blades 31*a*, 31*a* are moved in the direction of the rotating blades 31*b*, 31*b* (in the direction of the arrow D2 in FIG. 5), as well as are traveled in the direction of the arrow D3 in FIG. 5. At this case a curved surface process to form a radius r (R process) is carried out on each of the edge portions 32 of at least one of the rotating blades 31*a*, 31*b* (only the rotating blade 31*a* in FIG. 6) and each of the edge portions 32 is chamfered in a curved shape. The radius r is set as a value which is equal to or more than 1/50 thickness t of the cladding material 30 (r≧t/50). The rotating blade to be traveled is the rotating blade to which the curved surface process is carried out. In case R process is carried out to both of the rotating blades 31*a*, 31*b*, both thereof may be moved closer with each other.

This cutting device 31 cuts the cladding material 30 the Vickers hardness of which is adjusted, which generates a cutting shear drop 41 in the cutting portion 35. As a result, the conductor-sheet metal (the conductor-sheet metal 12*b* in FIG. 3) and the core-sheet metal (the core-sheet metal 11 in FIG. 3) of the cladding material 30 are deformed as dragged (caught in) by the edge portion 32 of the rotating blade 31*a* traveling toward the rotating blade 31*b*. When these respective materials are deformed, the conductor-sheet metal softer than the core-sheet metal is larger in deformation amount than the core-sheet metal. As a result, the conductor-sheet metal is deformed to wrap the side end face of the core-sheet metal, thereby to provide the straight angle conductor 10 shown in FIG. 3.

Herein the reason why a Vickers hardness of the core-sheet metal 11 is equal to or less than 150 Hv and that of the conductor-sheet metals 12*a*, 12*b* is equal to or less than 100 Hv will be described as follows. The Vickers hardness of each of the materials is set as less than a predetermined value, which therefore, provides flexibility to the cladding material 30 and improves toughness performance thereof. Accordingly viscosity is generated in the cutting portion 35 during the cutting of the cladding material 30, which promotes generation of the cutting shear drop 41. On the other hand, if the Vickers hardness of each of the materials exceeds a predetermined value, rigidity of the cladding material 30 becomes too high, and thereby the cutting shear drop 41 is less likely to be generated in the cutting portion 35, which interrupts generation of the closed-met portion 13 shown in FIG. 3.

And by carrying out a curve process as a radius r which is equal to or more than 1/50, preferably 1/30–1/10 thickness of the cladding material 30 to each of the edge portions 32 of at least one of the rotating blades 31*a*, 31*b* (only the rotating blade 31*a* in the FIG. 6), a cutting angle in the cutting portion 35 of the cladding material 30 becomes obtuse.

Accordingly the cutting shear drop 41 sufficient in quantity can be generated in the cutting portion 35. As a result, the conductor-sheet metal having the cutting shear drop 41, as shown in FIG. 3, can cover and wrap the entirety of the core-sheet metal 11, especially the side end face thereof. If the size of the radius r is less than 1/50 thickness of the core-sheet metal 11, the cutting shear drop 41 becomes less likely to be generated in the cutting portion 35, which causes no generation of the closed-met portion 13 shown in FIG. 3.

A cutting device is not limited to a device having the rotating blades 31*a*, 31*b* with a slit method, but only if a method by using a pair of cutting blades, such as a cutting machine using an upper and a lower mold is used, it can provide the same effect. In the case of use of the cutting machine, an edge of at least one of an upper and a lower mold is machined to have a curved surface having a radius r equal to or more than 1/5 thickness t of the cladding material 30.

A method of manufacturing the best mode of the straight angle conductor 10 is carried out in such a way that the cutting device 31 as shown in FIG. 5 is used where each of the edge portions 32 of at least one of the rotating blades 31*a*, 31*b* is machined to have a curved surface having a radius r which is 1/30–1/10 thickness t of the cladding material 30 and the cutting device 31 cuts the cladding material 30 formed of combining the core-sheet metal 11 having a Vickers hardness of 110–130 Hv with the conductor-sheet metals 12*a*, 12*b* having a Vickers hardness of 60–80 Hv.

Next, operations of the present embodiment will be explained.

According to the method of manufacturing the straight angle conductor 10 of the present embodiment, the cutting end faces of the core-sheet metal can be covered and wrapped with the conductor-sheet metal simply by cutting the cladding material 30. Namely the straight angle conductor 10 is provided with the closed-met portions 13 configured so that both side end faces of the core-sheet metal 11 are wrapped by the conductor-sheet metals 12*a*, 12*b*. Accordingly it is possible to cost-effectively manufacture a straight angle conductor 10 with a small thermal expansion co-efficiency and a good corrosion resistance.

Next, a second embodiment of the present invention will be explained with reference to accompanying drawings.

Second Embodiment

Figure 7:
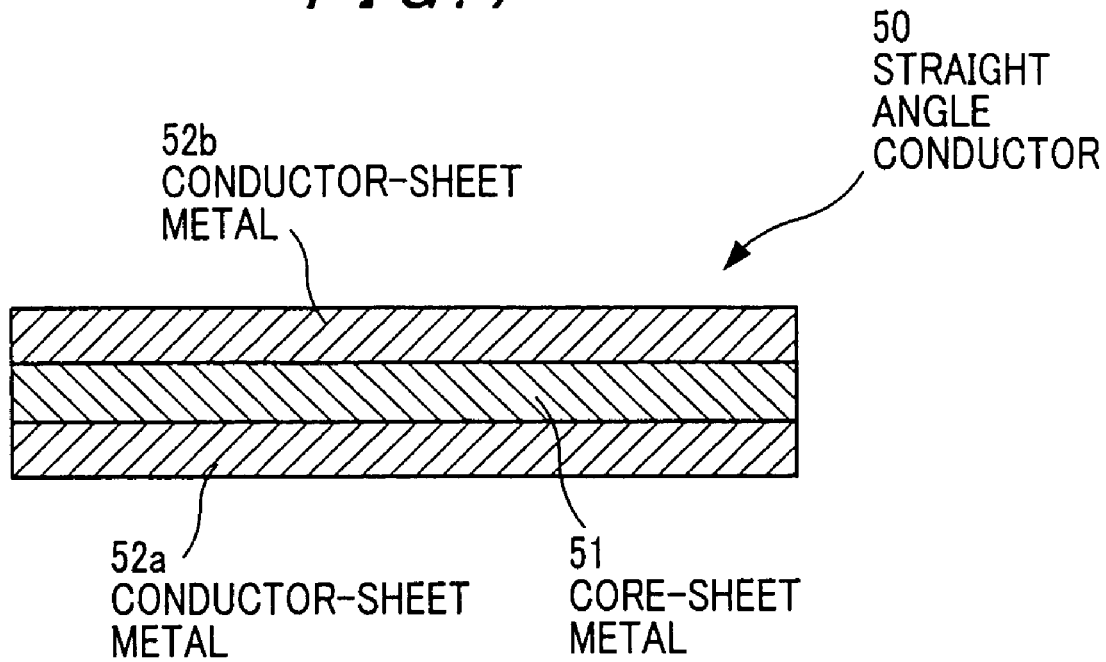
FIG. 7 is a transverse sectional view of a straight angle conductor according to a second embodiment of the present invention.

FIG. 7 shows a transverse sectional view of a straight angle conductor of the preferred second embodiment according to the present invention.

As shown in FIG. 7, a straight angle conductor 50 according to the present embodiment includes a cladding material in which both faces of the core-sheet metal 51 having a thermal expansion coefficient equal to or less than 10 ($\times 10^{-6}$/C. °) are sandwiched by conductor-sheet metals 52*a*, 52*b* having a volume resistivity equal to or less than 5.0 ($\mu\Omega \cdot$cm).

And the conductor-sheet metals 52*a*, 52*b* have a random isotropic crystal orientation and an IR value shown in the following equation, which is equal to or sore than 0.15, preferably 0.20–0.70, particularly preferably 0.35–0.70.

$$IR=I(111)/\{I(200)+I(111)\} \geq 0.15.$$

Herein I (111): X ray diffraction intensity of Surface (111). I (200): X ray diffraction intensity of surface (200).

The core-sheet metal and the conductor-sheet metals which are similar to the core-sheet metal 11 and the conductor-sheet metals 12*a*, 12*b* shown in the first embodiment can be applied as the core-sheet metal 51 and the conductor-sheet metals 52*a*, 52*b* of the straight angle conductor 50.

The straight angle conductor 50 according to the present embodiment is manufactured by a method such as the method (a slit method) the same as that of the straight angle conductor 80 shown in FIG. 2, or a cutting process method and the method is not limited particularly thereto.

The best mode of the straight angle conductor 50 is formed of a combination of the core-sheet metal 51 made of INVER (registered trademark) and the conductor-sheer metals 52a, 52b made of Ag or Ag alloy having an IR value of 0.35–0.70.

Figure 8:
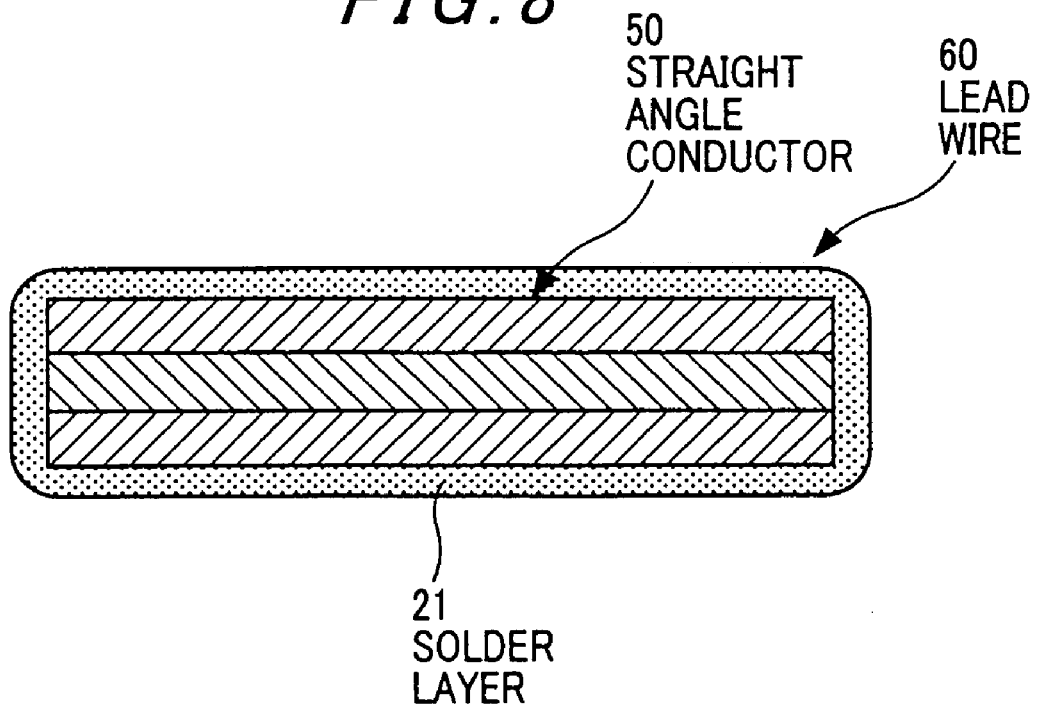
FIG. 8 is a transverse sectional view of a lead wire using the straight angle conductor in FIG. 7.

A lead wire 60 as shown in FIG. 8 is produced by coating an entire outer surface of the straight angle conductor 50 shown in FIG. 7 with the solder layer 21 shown in FIG. 4.

Herein it may be sufficient only to coat a part of the outer surface of the straight angle conductor 50 (for instance, an upper surface and a lower surface of the straight angle conductor 50) with the solder layer 21. This lead wire 60 is connected to a predetermined contact area (for instance, Ag coating area) of the cell surface in the silicon crystal wafer (a solar cell module, not shown) and a predetermined contact area of the frame material, to provide a solar cell assembly.

The best mode of the lead wire 60 is formed of coating an outer surface of the straight angle conductor 50 with the solar layer 21 the thickness of which is equal to ⅕ that of the straight angle conductor 50, wherein the straight angle conductor 50 is formed by combination of the core-sheet metal 51 having the INVER (registered trademark) and the conductor-sheet metals 52a, 52b made of the Ag, the Ag alloy and having an IR value of 0.35–0.70.

Operations of the present embodiment will be explained.

The reason why the IR value of the conductor-sheet metals 52a, 52b is set as equal to or more than 0.15 will be described below. An orientation (orientation of normal direction of the cladding material surface) inside the surface of crystal grain in the conductor-sheet metals 52a, 52b is mainly dominated by the surface (111) and the surface (200). As described in the first embodiment, the cladding material is produced in a way that first the core-sheet metal 51 is sandwiched by the conductor-sheet metals 52a, 52b, and then a cold rolling work and a thermal treatment are repeatedly carried out to the combined metals.

In manufacturing the cladding material, when the surface (200) becomes dominant in the surface orientation of recrystallized-grain texture in the conductor-sheet metals 52a, 52b, in other words, when the IR becomes less than 0.15, the recrystallized grain is coarsened. As a result, when the lead wire 60 using the straight angle conductor 50 shown in FIG. 7 is corrected to be linear by exerting tensile stress on the lead wire 60 so that it can be more easily soldered to the contact area in the silicon crystal wafer, warping is more likely to be generated in the lead wire 20.

In the straight angle conductor 50 according to the present embodiment, the IR value of the conductor-sheet metals 52a, 52b is set equal to or more than 0.15 and therefore, the warping is not generated in correcting the straight angle conductor 50 to be linear by exerting the tensile stress on it, which causes the lead wire 60 with the straight angle conductor 50 to have a good solder characteristic.

And the straight angle conductor 50 according to the present embodiment is formed of the core-sheet metal 51 having a small thermal expansion coefficient at the center thereof and the conductor-sheet metals 52a, 52b having a low volume resistivity (good conductivity) at the outer surface thereof. Therefore, even if a silicon crystal wafer used for the solar cell assembly is configured to be flattened, no damage of the silicon crystal wafer is not possibly generated in soldering the read wire 60 with the straight angle conductor 50 to the silicon crystal wafer, as well as the power produced by the solar cell assembly can be outputted without nearly any losses.

Further, since a different-property contact portion between the core-sheet metal 51 and the conductor-sheet metals 52a, 52b exists on the outermost surface of the straight angle conductor 50 according to the present embodiment, when the straight angle conductor 50 is contacted to water components, it tends to cause an corrosion due to an electrical potential difference to be generated in the different-property contact portion. Accordingly it is preferable that in the lead wire 60 using the straight angle conductor 50 of the present embodiment, an entire outer surface of the straight angle conductor 50 is coated with the solder layer 21 except that there is no particular problem with the corrosion caused by the electrical potential difference, thereby to provide the lead wire 60 without any possible corrosion due to the electrical potential difference.

Moreover, the lead wire 60 using the straight angle conductor 50 of the present embodiment has a good solder characteristic to the silicon crystal wafer, which causes an improvement in productivity of the solar cell assembly.

Third Embodiment

A straight angle conductor of a third embodiment according to the present invention will be explained with reference to FIG. 3.

A basic construction of a straight angle conductor according to the present embodiment is the same as in the straight angle conductor 10 shown in FIG. 3, and the conductor-sheet metals 12a, 12b have further a random isotropic crystal orientation and an IR value shown in the following equation, which is equal to or more than 0.15, preferably 0.20–0.70, particularly preferably 0.35–0.70.

$$IR = I(111)/\{I(200)+I(111)\} \geq 0.15.$$

Herein I (111) X ray diffraction intensity of Surface (111). I (200): X ray diffraction intensity of Surface (200).

The straight angle conductor according to the present embodiment is manufactured by a method the same as the manufacturing method of the straight angle conductor 10 of the first embodiment described above.

The best mode of the straight angle conductor is formed by combining the core-sheet metal 11 made of the INVER (registered trademark) and having a Vickers hardness of 110–130 Hv with the conductor-sheet metals 12a, 12b made of Ag or Ag alloy and having a Vickers hardness of 60–80 Hv and IR value of 0.35–0.70. The best mode of the lead wire (not shown) is formed of coating the outer surface of the best mode of the straight angle conductor with the solder layer 21 (See FIG. 4) made of Su—Ag—Cu, the thickness of which is ⅕ thickness of the straight angle conductor.

Also in the straight angle conductor according to the present embodiment, the effect identical to that of the straight angle conductors 10, 50 according to the first and the second embodiment described above can be obtained. In particular, this straight angle conductor has a good corrosion resistance, as well as is constructed such that the warping is not generated when it is corrected to become linear by exerting tensile stress on it.

And in the lead wire using the straight angle conductor according to the present embodiment, the effect similar to that of the first and the second embodiment described above can be obtained. In particular, it is sufficient only to coat a part (the vicinity of a contact portion with each predetermined contact area) of the straight angle conductor with the solder layer 21, thereby to provide the lead wire at a lower cost and also the warping thereof is not generated, as a result to provide the lead wire with a good solder characteristic.

As described above, the present invention is not limited to the above-described embodiments, but various modifications can be apparent.

And a straight angle conductor of the present invention can be applied to a lead wire of a solar cell assembly and besides, to a conductor to transmit a high frequency signal equal to or more than 1 GHz. Particularly a straight angle conductor according to the present invention can be applied to a wireless LAN or the like a transmission property of which largely deteriorates depending upon a thermal expansion thereof.

Next, the present invention will be explained with reference to examples, but is not limited to the examples.

EXAMPLE 1

A straight angle conductor having a width of 2.0 mm and a thickness of 0.150 mm shown in FIG. 3 was manufactured with the construction of a core-sheet metal made of INVER (registered trademark) having a width of 2.0 mm and a thickness of 0.030 mm and a conductor-sheet metal made of Cu having a width of 2.0 mm, a thickness of 0.060 mm, and IR of 0.60.

The solder layer having a thickness of 0.035 mm was formed around this straight angle conductor, to manufacture the lead wire with the construction shown in FIG. 4.

EXAMPLE 2

The straight angle conductor was manufactured the same way as the Example 1 except that IR of the conductor-sheet metal was 0.40, and thereafter, the lead wire was manufactured.

Comparison 1:

The straight angle conductor was manufactured the same way as the Example 1 except that IR of the conductor-sheet metal was 0.12, and thereafter, the lead wire was manufactured.

Comparison 2:

The straight angle conductor was manufactured the same way as the Example 1 except that IR of the conductor-sheet metal was 0.03, and thereafter, the lead wire was manufactured.

Tensile stress of 210 MPa was exerted on each lead wire in Examples 1, 2 and Comparisons 1, 2 to solder the each thereof to a contact area of the cell surface in the silicon crystal wafer. The result under the stress is shown in Table 1.

TABLE 1

|  |  | IR *1 | WARPING |
|---|---|---|---|
| EXAMPLE | 1 | 0.60 | NO WARPING (FLAT) |
|  | 2 | 0.40 | NO WARPING (FLAT) |
| COMPARISON | 1 | 0.12 | LARGE |
|  | 2 | 0.03 | LARGE |

*1: IR = I (111)/(I (200) + I (111)).
Herein I (111): X ray diffraction intensity of Surface (111).
I (200): X ray diffraction intensity of Surface (200).

As shown in Table 1, since the lead wire of Example 1 or 2 included the conductor-sheet metal having the IR equal to or more than 0.15 (0.60, 0.40), the lead wire was corrected to be linear by stress application, to prevent generation of warping (be flattened). As a result, the lead wire of Example 1 or 2 was soldered to the silicon crystal wafer properly.

On the contrary, since the lead wire of Comparison 1 or 2 included the conductor-sheet metal having the IR less than 0.15 (0.12, 0.03), a large warping was generated regardless of exerting stress to regulate the lead wire to be linear. As a result, the lead wire of Comparison 1 or 2 was not well soldered to the silicon crystal wafer.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention is provided for illustration only, and not for the purpose of limiting the invention as defined by the appended claims and their equivalents.

The present invention is not limited to the above-described embodiments, but various improvements and changes thereof apparent to those skilled in the art within the scope of the spirit of the present invention are included.

What is claimed is:

1. A straight angle conductor for a lead wire, comprising:
   a cladding material comprising a core-sheet metal and a conductor-sheet metal that sandwiches both surfaces of the core-sheet metal,
   wherein the conductor-sheet metal wraps both side end faces of the core-sheet metal to prevent the core-sheet metal from being exposed to an outside of the conductor-sheet metal,
   wherein the conductor-sheet metal has a crystal orientation with the following feature:

$$IR = I(111)/\{I(200)+I(111)\} \geq 0.15,$$

where I (111) represents X ray diffraction intensity of Surface (111), and I (200) represents X ray diffraction intensity of Surface (200), and
   wherein the conductor-sheet metal is formed of Cu, Au, or Ag, or an alloy material comprising Cu or Au, and
   wherein the core-sheet metal has a Vickers hardness equal to or less than 150 Hv and the conductor-sheet metal has a Vickers hardness equal to or less than 100 Hv.

2. The straight angle conductor as defined in claim 1, wherein:
   the core-sheet metal is formed of an alloy material of Fe—Ni.

3. The straight angle conductor as defined in claim 1, further comprising:
   a solder layer that coats an entirety or a part of an outer surface of the cladding material.

4. The straight angle conductor as defined in claim 3, wherein:
   the solder layer includes a Sn—Pb solder layer.

5. The straight angle conductor as defined in claim 3, wherein:
   the solder layer includes a Pb-free solder layer.

6. The straight angle conductor as defined in claim 5, wherein:
   the Pb-free solder layer is made of a Sn—Ag—Cu base alloy.

7. The straight angle conductor as defined in claim 6, wherein: the Sn—Ag—Cu base alloy further includes at least one of In and P.

8. A straight angle conductor for a lead wire, comprising:
   a cladding material comprising a core-sheet metal and a conductor-sheet metal that sandwiches both surfaces of the core-sheet metal,
   wherein the conductor-sheet metal having a volume resistivity equal to or less than 5.0 μΩ·cm wraps both side end faces of the core-sheet metal having a thermal expansion coefficient equal to or less than $10 \times 10^{-6}/°C$.

to prevent the core-sheet metal from being exposed to an outside of the conductor-sheet metal, wherein the conductor-sheet metal has a crystal orientation with the following feature:

$$IR=I(111)/\{I(200)+I(111)\}\geq 0.15.$$

where I (111) represents X ray diffraction intensity of Surface (111), and I (200) represents X ray diffraction intensity of Surface (200), wherein the conductor-sheet metal is formed of Cu, Au, or Ag, or an alloy material comprising Cu or Au, and wherein the core-sheet metal has a Vickers hardness equal to or less than 150 Hv and the conductor-sheet metal has a Vickers hardness equal to or less than 100 Hv.

9. A straight angle conductor for a lead wire, comprising:

a cladding material comprising a core-sheet metal having a thermal expansion coefficient equal to or less than $10\times 10^{-6}/°$ C. and a conductor-sheet metal having a volume resistivity equal to or less than 5.0 μΩ·cm that sandwiches both surfaces of the core-sheet metal, wherein the conductor-sheet metal has a crystal orientation with the following feature:

$$IR=I(111)/\{I(200)+I(111)\}\geq 0.15.$$

where I (111) represents X ray diffraction intensity of Surface (111), and I (200) represents X ray diffraction intensity of Surface (200), wherein the conductor-sheet metal is formed of Cu, Au, or Ag, or an alloy material comprising Cu or Au, and wherein the core-sheet metal has a Vickers hardness equal to or less than 150 Hv and the conductor-sheet metal has a Vickers hardness equal to or less than 100 Hv.

* * * * *